United States Patent [19]

Sears

[11] Patent Number: 4,470,010

[45] Date of Patent: Sep. 4, 1984

[54] PIEZOELECTRIC APPARATUS FOR SENSING MOVEMENT OF A MOVING ELEMENT SUCH AS A DIAL ARM OF A UTILITY METER

[76] Inventor: Lawrence M. Sears, 3263 Glencairn Rd., Shaker Heights, Ohio 44122

[21] Appl. No.: 311,531

[22] Filed: Oct. 15, 1981

[51] Int. Cl.³ .................... G01R 29/00; H01L 41/08
[52] U.S. Cl. .................................... 324/157; 310/339
[58] Field of Search ......................... 324/157; 310/339

[56] References Cited

U.S. PATENT DOCUMENTS

| 498,372 | 5/1893 | Ward | |
|---|---|---|---|
| 2,447,588 | 8/1948 | McNairn | 73/116 |
| 2,691,159 | 10/1954 | Heibel | 310/339 |
| 3,333,111 | 7/1967 | Houle | 307/88.5 |
| 3,813,597 | 5/1974 | LeVitt | 324/176 |
| 3,835,372 | 9/1974 | Adair | 324/157 |
| 4,379,245 | 4/1983 | Goldstein | 310/339 |

Primary Examiner—Gerard R. Strecker
Assistant Examiner—Walter E. Snow
Attorney, Agent, or Firm—Yount & Tarolli

[57] ABSTRACT

Retrofit apparatus (38) for attachment to a utility meter (10) to detect revolutions of a dial arm (34) of the utility meter. A piezoelectric crystal (42) is provided against which a striker arm (52) abuts. The striker arm is rotatable on an axle (50) and is therefore movable relative to the piezoelectric crystal. A spring (54) is tensioned so as to resiliently bias the striker arm against the crystal. A shoe (62) is also mounted on the axle and is disposed in the path of rotation of the dial arm so that once each revolution the dial arm engages, deflects, and releases the shoe, thereby causing the striker arm to withdraw from and then snap back against the piezoelectric crystal. The crystal produces an electrical pulse in response. The pulses are counted by a counter (82) to provide a count indicative of utility usage.

15 Claims, 5 Drawing Figures

PIEZOELECTRIC APPARATUS FOR SENSING MOVEMENT OF A MOVING ELEMENT SUCH AS A DIAL ARM OF A UTILITY METER

BACKGROUND AND FIELD OF THE INVENTION

The present invention relates to a method and apparatus for sensing the passage of a moving element, and more particularly provides apparatus for detecting the rotation of the dial arm of a utility meter.

Metering devices are used by utility companies to register the amount of energy, water, etc. consumed by residential and commercial users. These utility meters generally are mechanical devices having a meter face with a number of dials disposed thereon, registering utility usage in increments of tens, hundreds, thousands, etc. Such utility meters, most notably gas meters, are generally located within the private dwellings of the residential customers and are therefore not readily accessible to utility company employees. The meter readings must be periodically taken, however, in order to ascertain the amount of utility usage and thus determine the appropriate bill to be forwarded to the customer.

It has therefore been long recognized that it would be desirable if the utility meter were mounted external to the dwelling, whereby the utility meter reader would have continual access to the meter and the customer would be free of the obligation to permit strangers to enter their homes. Unfortunately, it would be prohibitively expensive to replace existing utility meters with other meters capable of being read from outside the customers residence.

One other method of accomplishing the same goal would to provide a retrofit device connectable to existing utility meters and designed to be read externally from outside of the customers residence. Such a device would presumably be coupled to the existing meter and would provide electrical signals indicative of utility usage. The electrical signals could then be communicated to the outside of the residence by ordinary wires. In order to be successful, the retrofit device would have to be inexpensive to manufacture, simple to install, and reliable in its operation. No such device has yet appeared on the market.

SUMMARY OF THE INVENTION

It has now been recognized that one possible retrofit manner of detecting utility usage would be to detect the rotation of the smallest increment dial of the utility meter and to count one unit for each revolution of that dial. To accomplish this some method and apparatus must be provided for sensing the passage of the dial arm past a given location.

In accordance with the present invention, an apparatus of this type is provided, including a piezoelectric element, a striker adapted to abut the piezoelectric element, and means for resiliently biasing the piezoelectric element and the striker against one another. Means are included for disposing one of the piezoelectric or striker elements in the path of movement of the moving element (e.g., the meter dial) such that, in passing that one of the elements, the moving element of the meter engages it, deflects it away from the other of the two elements, and releases it whereby it snaps back against the other under the urging of the resilient biasing means, causing the piezoelectric element to generate an electrical pulse.

The electrical pulses produced by this device can easily be counted to provide an electrical signal indicative of utility usage. This electrical signal can readily be communicated to outside of the custmers dwelling, whereby it will be accessile for reading.

A device such as described above can be produced inexpensively, can be easily mounted on existing meters, and has been found to be reliable in use. Furthermore, it does not block the meter face, hence a utility employee can read the meter without removing the device. It therefore fulfills all of the requirements of the retrofit device hitherto lacking in the art.

BRIEF DESCRIPTION OF THE DRAWINGS

The foregoing and other objects and advantages of the present invention will become more readily apparent from the following detailed description, as taken in conjunction with the accompanying drawings wherein.

DETAILED DESCRIPTION

Figure 1:
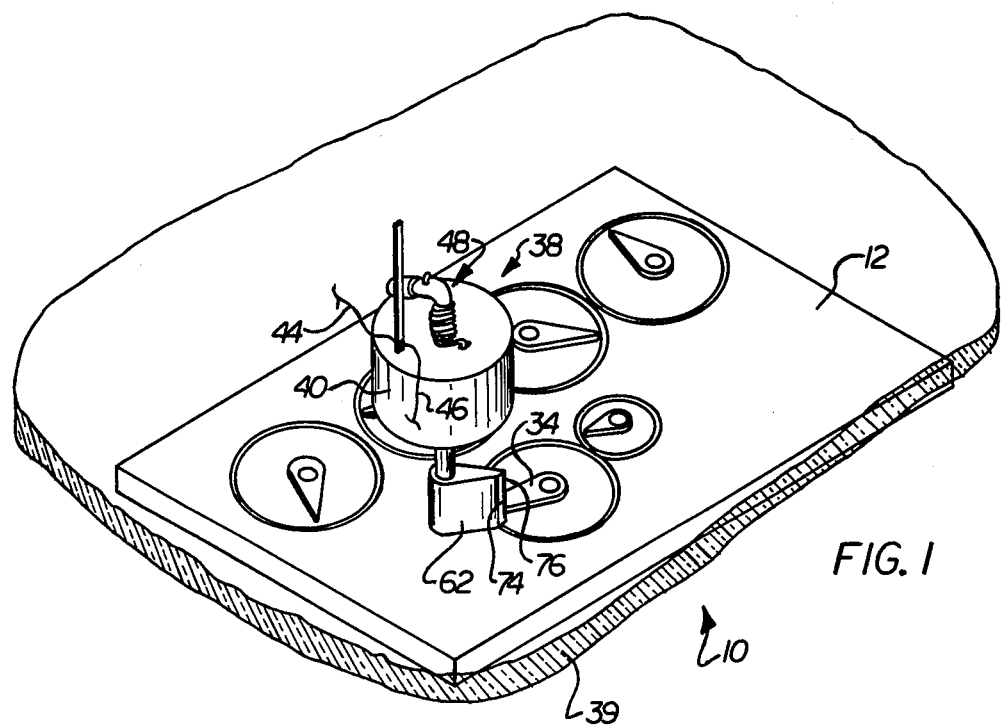
FIG. 1 is a perspective illustration of a device in accordance with the teachings of the present invention, as mounted on the face of a utility meter.
Figure 2:
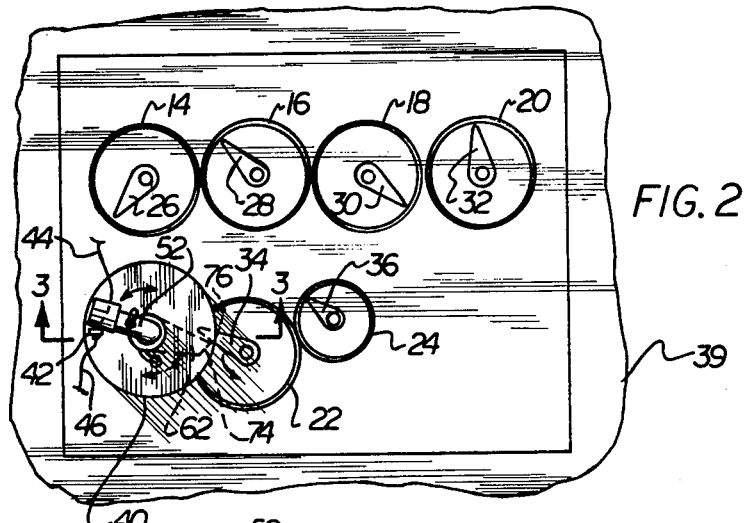
FIG. 2 is a plan view of the apparatus shown in perspective in FIG. 1.
Figure 4:
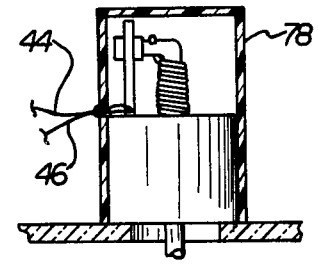
FIG. 4 is similar to FIG. 3 but show the device covered by a cap.
Figure 3:
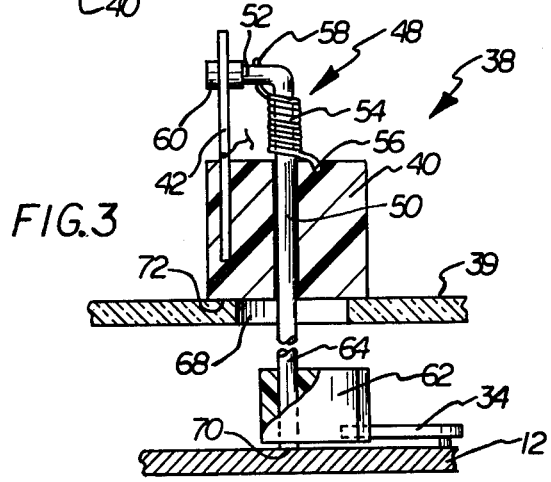
FIG. 3 is a sectional elevation view taken along lines 3—3 of FIG. 2.

Referring now to the Figures, there is shown in FIGS. 1, 2, 3 and 4 a portion of a conventional utility meter, such as a gas meter, electric meter, etc. The utility meter portion 10 includes a face plate 12 upon which are mounted several dials 14, 16, 18, 20, 22 and 24. The meter mechanism causes the dials to rotate in response to utility usage. Each dial includes a corresponding dial arm 26–36, all of which are coupled together by gearing mechanisms located beneath the face plate 12 and not shown in the Figures. The dials 14, 16, 18 and 20 are geared to one another such that each dial arm rotates at one-tenth the rate of its nearest righthand neighbor. Thus, the dial arm 30 rotates at one-tenth the rate of dial arm 32, whereas the dial arm 28 rotates at one-tenth the rate of dial arm 30. Presuming that the meter registers amount of usage of natural gas, the dial 20 may indicate tens of cubic feet used by the customer, the dial 18 may indicate hundreds of cubic feet, and the dials 16 and 14, respectively, indicate thousands and tens of thousands of cubic feet of usage. The remaining two dials 22 and 24 indicate smaller increments of utility usage. Thus, for example, the dial arm 36 may rotate one full revolution for each half cubic foot of usage, whereas the dial 34 may rotate one full revolution for each two cubic feet of gas used by the customer.

In order to provide a remote utility meter reading, some means should preferably be provided for converting utility usage into electrical signals. This is preferred because electrical signals can be readily communicated from one point to another, permitting the reading to be taken at some place remote from the actual physical location of the meter. In accordance with the present invention this translation of the utility meter reading into electrical signals is performed by a trip device 38 fastened to the transparent window 39 covering the meter dial face 12. The device 38 is tripped once in each revolution of a selected dial arm of the utility meter, and provides an electrical pulse in response to being thus tripped. As shown in the Figures, the trip device 38 includes a pill-shaped base 40 composed of a suitable insulating material. A bar 42 of piezoelectric material protrudes longitudinally from one face of the base 40. The piezoelectrical crystal 42 has a rectangular cross section and has electrodes formed on the opposing broader sides thereof. Wires 44 and 46 are electrically connected to these electrodes. In the embodiment illustrated in the Figures, the piezoelectric bar is oriented substantially normal to the face of the base 40 from which it extends. Because of the nature of the piezoelectric material of which the bar 42 is constructed, an electrical impulse is provided across the wires 44 and 46 whenever the degree of mechanical strain applied to the bar 42 abruptly changes.

A striker element 48 has an axial portion 50 which extends through the base material 40 in a direction substantially parallel to the orientation of the bar 42. The axle 50 is rotatable within the base 40 such that a radially extending striker arm portion 52 is rotatable towards or away from the piezoelectric bar 42. The striker arm 52 has a radial dimension which is in excess of the distance separating the bar 42 from the axle 50, whereby the arm 52 may abut one of the faces of the piezoelectric bar 42 upon which an electrode is formed. Preferably, the portion of the striker arm 52 abutting the bar 42 has a collar 60 mounted thereon. The collar is composed of an electrically insulating material so as to electrically isolate the piezoelectric bar 42 from the striker element 48 and also provides some cushioning of the blows imparted to the piezoelectric bar 42 by the striker arm 52. A spring 54 is coiled around the axle 50 and has one end 56 anchored within the base 40 and the other end 58 anchored to the striker arm 52.

The spring 54 is assembled with the striker element 48 on the base 40 before the piezoelectric crystal 42 is inserted. The striker arm 52 is then rotated several turns to tension the spring 54, after which the crystal 42 is inserted into the base 40. The bar 42 prevents counter-rotation of the arm 52. The spring 54 therefore resiliently biases the striker arm 52 against the piezoelectric bar 42. If the striker arm 52 is rotated away from the bar 42 and then released, it will snap back into contact with the piezoelectric bar 42 under the resilient urging of the spring 54, whereby a mechanical impulse will be applied to the piezoelectric bar. The piezoelectric bar produces an electrical impulse in response to each such mechanical impulse.

The impulse generation thus described is tripped by means of a shoe 62 attached to the opposite end of the axle portion 50 of the striker element 48. As can best be seen in FIG. 3, the axle 50 extends entirely through and substantially beyond the base 40 of the trip device 38, thereby providing an exposed portion 64 to which the shoe 62 can be attached. The shoe 62 is rigidly affixed to the exposed axle portion 64 and provides a lever arm by which the striker element can be rotated to deflect the striker arm 52 away from the piezoelectric crystal bar 42.

In practice, a hole 68 large enough to permit the shoe 62 to pass through it will be drilled through the transparent window 39 covering the meter face. The shoe 62 will then be inserted through the hole 68 into the opening between the window 39 and the meter face 12. The length of the exposed axle portion 64 of the striker element 48 is preferably somewhat greater the total distance separating the top of the transparent window 39 from the meter face 12. Therefore, when the shoe 62 is inserted through the opening 68 the distal end 70 of the exposed axle portion 64 will abut the face 12 of the meter before the bottom surface 72 of the base 40 abuts the top surface of the meter window 66. When being installed the bottom surface of the base 40 will be forced down further into contact with the meter window 66, causing the axle 50 to slide axially through the base 40 against the tension of the spring 54, and glued in that position. When installed thusly, the spring 54 not only resiliently biases the striker arm 52 against the piezoelectric bar 42, but also applies tension to the axle 50 of the striker element 48 so as to force the distal end 70 thereof against the meter 12. This assures that the shoe 62 operates at the preferred spacing from the meter face 12.

The location at which the base 40 is glued against the meter window 66 will be such that the radial extremity of the shoe 62 protrudes into the path of rotation of the dial arm 34. Since the opening 68 created in the window 39 is much larger than the diameter of the axle 50, there is room for substantial adjustment of the transverse position of the shoe, hence the desired transverse spacing can be readily provided. The diameter of the base 40 is great enough, however, to in all cases completely cover the hole 68, whereby when glued in place it will seal the opening in the window.

The windows 39 of gas meters are often sealed to the meter in order to prevent gas leakage should gas somehow invade the meter housing. To insure the integrity of this gas seal it is preferable that the trip device 38 be covered by a cap 78, shown in FIG. 4. The cap 78 has the shape of an inverted cup and has a cylindrical wall which is sealed to the base portion 40 by a suitable sealing compound. The wires 44 extend through an opening in the cap 78. This opening is sealed by the sealing compound, also, whereby the entire trip device 38 is hermetically sealed to the meter.

Because of the location of the shoe 62, the dial arm 34 will in each revolution engage the shoe 62, deflect it against the bias of the spring 54 such that the striker arm 52 retracts from the piezoelectric bar 42, and then release it. Upon release the striker arm 48 snaps back into contact with the piezoelectric crystal, creating the aforementioned mechanical and electrical impulses and thereby indicating that one revolution of the dial arm 34 has taken place. The shoe 62 preferably has a face 74 (best seen in FIG. 2) at its radial extremity which tapers radially away from a leading edge 76 to insure that the dial arm 34 will not catch on any part of the shoe after releasing its leading edge.

The device 38, it will be noted, provides very little obstruction of the meter dials. Because of this, a meter reading may be taken visually without removing the trip device 38.

Figure 5:
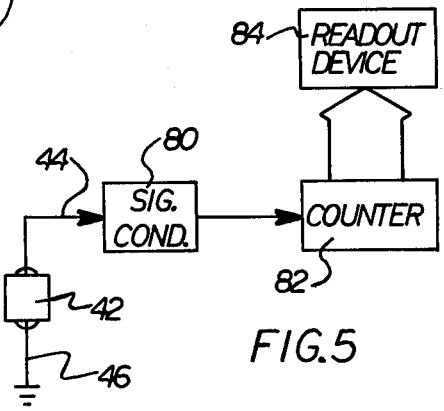
FIG. 5 is a block diagram of one form of utility usage registering device to which the apparatus of the present invention can be coupled.

FIG. 5 illustrates one possible embodiment of the electrical circuitry to which the leads 44 and 46 of the piezoelectric bar 42 may be attached. As shown in FIG. 5, one of the leads 46 is grounded. The other lead 44, which may be considered to be the signal lead, is directed to a signal conditioning circuit 80. The signal conditioning circuit 80 is included to convert each electrical impulse provided by the piezoelectric crystal 42 (which may actually comprise a number of separate impulses) into a single electrical pulse of known amplitude and duration. The signal conditioning circuit 80 includes a clipping circuit to clip the electrical impulse at a preselected maximum potential and a monostable multivibrator responsive to each clipped impulse for providing a single, well defined electrical pulse of known duration in response. The output of the monostable multivibrator represents the output of the signal conditioning circuit 80.

A multi-state binary counter 82 has its "count" input connected to the output of the signal conditioning circuit 80. The counter counts the number of pulses which appear at its "count" input and therefore accumulates a count corresponding to the number of pulses generated by the signal conditioning circuit 80. Since the signal conditioning circuit 80 provides one electrical pulse each time the device 38 is tripped by the dial arm 34, the count contained within the counter 82 also represents the number of revolutions of the dial arm 34. This, in turn, corresponds with the amount of utility usage. A read-out device 84, which may provide an alphanumeric read-out and/or a machine readable output, is connected to the counter 82 so as to permit a meter reader to determine the contents of the counter 82. The read-out device 84 may be located remote from the meter 10, and could readily be mounted external to a residential customers dwelling.

Although the invention has been described with respect to a preferred embodiment, it will be appreciated that various rearrangements and alterations of parts may be made without departing from the spirit and scope of the invention, as defined by the appended claims.

What is claimed is:

1. Apparatus for detecting utility usage as registered by a utility meter having a dial arm disposed on a meter face covered by a transparent window, comprising:
   a base portion mounted over a hole in said transparent window at a position close to said dial arm,
   a rotatable axle extending through said base portion and said window hole towards said meter face,
   striker means and piezoelectric means, one of said means being fixed to said axle and the other of said means being fixed to said base portion, said striker means and piezoelectric means being positioned relative to one another such that as said axle rotates, said one of said means moves into abutment with said other of said means,
   means for resiliently biasing said one of said means towards abutment with said other of said means, and
   a trip lever extending radially from the end of said axle which is proximal said meter face into the path of rotation of said dial arm, such that as said dial arm rotates, it catches, deflects, and then releases said trip lever, thereby causing said one of said means to withdraw from and then snap back against said other of said means, whereby said piezoelectric means generates an electrical signal.

2. Apparatus as set forth in claim 1 wherein said striker arm extends radially from and is rotatable with said axle, and further wherein said resilient biasing means comprises a coil spring mounted coaxially upon said axle, said coil spring having one end fixed relative to said base portion and the other end attached to said striker arm, said coil spring be rotationally tensioned such that it resiliently biases said striker arm against said piezoelectric means.

3. Apparatus as set forth in claim 2, wherein said axle has a length great enough that, when said base portion is mounted on said transparent window, said meter face abuts said axle and forces its axially through said base portion against the bias of said coil spring whereby said coil spring forces said axle into an abutting relationship with said meter face during mounting.

4. Apparatus as set forth in claim 1, wherein the axial ends of said rotatable axle project from opposite sides of said base portion, and wherein said striker means is mounted to the axial end opposite the end upon which said trip lever is mounted.

5. Apparatus as set forth in claim 4 wherein said piezoelectric means comprises a bar of piezoelectric crystal, said bar projecting from said base in an orientation substantially parallel to said axle whereby impacts by said striker means cause bending of said piezoelectric crystal.

6. Apparatus as set forth in claim 1, further comprising counter means for counting the number of said electrical signals generated by said piezoelectric means so as to thereby accumulate a count representative of the number of dial arm revolutions.

7. Apparatus as set forth in claim 1, wherein the portion of said striker arm which abuts said piezoelectric means is covered by a collar of impact-cushioning material.

8. Apparatus as set forth in claim 1, wherein the radial extremity of said trip lever is beveled to insure that said trip lever does not catch upon said dial arm a second time, after initially being released threby, in each revolution of said dial arm.

9. Apparatus as set forth in claim 1, wherein the axial ends of said rotatable axle project from opposite sides of said base portion, wherein said trip lever and said striker arm are affixed to opposite axial ends of said axle, and wherein said trip lever is smaller than said base portion such that said window hole can be selected to be small enough to be completely covered by said base portion while still large enough to admit said trip lever.

10. Apparatus as set forth in claim 9, wherein said resilient biasing means further resiliently biases said axle into axial abutment with said meter face when said apparatus is mounted on said utility meter.

11. Apparatus as set forth in claim 10, wherein said resilient biasing means comprises a coil spring mounted coaxial with said rotatable axle, having one end anchored relative to said base and its other end anchored relative to said rotatable axle.

12. Apparatus as set forth in claim 1 and further comprising bonding means for bonding said base portion over said hole to form a hermetic seal between said window and said base portion.

13. Apparatus as set forth in claim 1, wherein said axle is free to slide axially through said base portion and wherein said resilient biasing means includes means for resiliently urging said axle in an axial direction towards said meter face.

14. Apparatus as set forth in claim 13, wherein said resilient biasing means comprises a coil spring coaxially mounted on said axle, having a first end fixed relative to said base portion and a second end fixed relative to said axle, said coil spring providing both the rotational and axial forces required of said resilient biasing means.

15. Apparatus for detecting utility usage as registered by a utility meter having a dial arm disposed on a meter face covered by transparent window, comprising:

a base portion mounted over a hole in said transparent window at a position close to said dial arm, a rotatable axle extending through said base portion and said window hole towards said meter face, a bar of piezoelectric crystal, said bar projecting from said base in an orientation substantially parallel to said axle, a striker arm fixed to said axle, said striker arm radially projecting far enough that as said axle rotates, said striker arm moves into abutment with said bar of piezoelectric cyrstal, means for rotationally urging said axle to resiliently bias said striker arm into abutment with said bar, and a trip lever extending radially from the end of said axle which is proximal said meter face into the path of rotation of said dial arm, such that as said dial arm rotates, it catches, deflects, and then releases said trip lever, thereby causing said striker arm to withdraw from and then snap back against said bar of piezoelectric crystal, whereby said piezoelectric bar bends upon impact and thus generates an electrical signal.

* * * * *